US010566481B2

(12) United States Patent
Iwamoto et al.

(10) Patent No.: US 10,566,481 B2
(45) Date of Patent: Feb. 18, 2020

(54) SOLAR BATTERY MODULE AND MANUFACTURING METHOD THEREFOR

(71) Applicants: TOYOTA JIDOSHA KABUSHIKI KAISHA, Toyota-shi, Aichi-ken (JP); KABUSHIKI KAISHA TOYOTA JIDOSHOKKI, Kariya-shi, Aichi (JP)

(72) Inventors: Shoichi Iwamoto, Izunokuni (JP); Kazutaka Kimura, Mishima (JP); Hirotaka Inaba, Kariya (JP)

(73) Assignees: TOYOTA JIDOSHA KABUSHIKI KAISHA, Toyota (JP); KABUSHIKI KAISHA TOYOTA JIDOSHOKKI, Kariya (JP)

( * ) Notice: Subject to any disclaimer, the term of this patent is extended or adjusted under 35 U.S.C. 154(b) by 0 days.

(21) Appl. No.: 16/000,389

(22) Filed: Jun. 5, 2018

(65) Prior Publication Data
US 2018/0358493 A1 Dec. 13, 2018

(30) Foreign Application Priority Data
Jun. 9, 2017 (JP) ................................ 2017-114726

(51) Int. Cl.
*H02N 6/00* (2006.01)
*H01L 31/042* (2014.01)
(Continued)

(52) U.S. Cl.
CPC ............ *H01L 31/049* (2014.12); *B60L 8/003* (2013.01); *B60L 50/64* (2019.02); *B60L 50/66* (2019.02);
(Continued)

(58) Field of Classification Search
CPC ................. H01L 31/049; H01L 31/048; H01L 31/035281; H01L 31/18; B60L 8/003; H02S 10/40
See application file for complete search history.

(56) References Cited

U.S. PATENT DOCUMENTS 4,888,061 A * 12/1989 Wenz ................ H01L 31/03921
136/251
2005/0098202 A1 * 5/2005 Maltby, Jr. .......... H01L 31/0296
136/256
(Continued)

FOREIGN PATENT DOCUMENTS

JP  2003-086822 A  3/2003
JP  2012-074530 A  4/2012
(Continued)

*Primary Examiner* — Angelo Trivisonno
(74) *Attorney, Agent, or Firm* — Oliff PLC

(57) ABSTRACT

A solar battery module includes: a front face protective sheet at a first side; a sheet-shaped solar battery cell disposed at a second side, the second side being an opposite side from the first side with respect to the front face protective sheet; a backing sheet disposed at the second side with respect to the solar battery cell; and an encapsulation layer provided between the front face protective sheet and the backing sheet, and encapsulating the solar battery cell. A convexly-curved portion is provided at the backing sheet to overlap the solar battery cell, and curves convexly toward a solar battery cell side, the solar battery cell curves in accordance with the convexly-curved portion, and a rigidity of the convexly-curved portion with respect to a load acting in the sheet thickness direction of the solar battery cell is higher than a rigidity of the solar battery cell.

17 Claims, 4 Drawing Sheets

(51) Int. Cl.
  *H01L 31/049*     (2014.01)
  *H01L 31/0352*   (2006.01)
  *B60L 8/00*       (2006.01)
  *H01L 31/18*      (2006.01)
  *H02S 10/40*      (2014.01)
  *B60L 50/64*      (2019.01)
  *H02S 20/23*      (2014.01)
  *B60L 50/60*      (2019.01)
  *H01L 31/048*     (2014.01)

(52) U.S. Cl.
  CPC .... *H01L 31/035281* (2013.01); *H01L 31/048* (2013.01); *H01L 31/18* (2013.01); *H02S 10/40* (2014.12); *H02S 20/23* (2014.12)

(56) References Cited

U.S. PATENT DOCUMENTS

| | | | | |
|---|---|---|---|---|
| 2010/0159242 A1* | 6/2010 | Bhagavatula | ....... | H01L 21/2225 |
| | | | | 428/375 |
| 2012/0085392 A1* | 4/2012 | Albert | .................. | G06F 21/604 |
| | | | | 136/251 |

FOREIGN PATENT DOCUMENTS

| | | |
|---|---|---|
| JP | 2015-170817 A | 9/2015 |
| JP | 6057113 B1 | 1/2017 |
| WO | 2012/115154 A1 | 8/2012 |
| WO | 2017/110761 A1 | 6/2017 |

\* cited by examiner

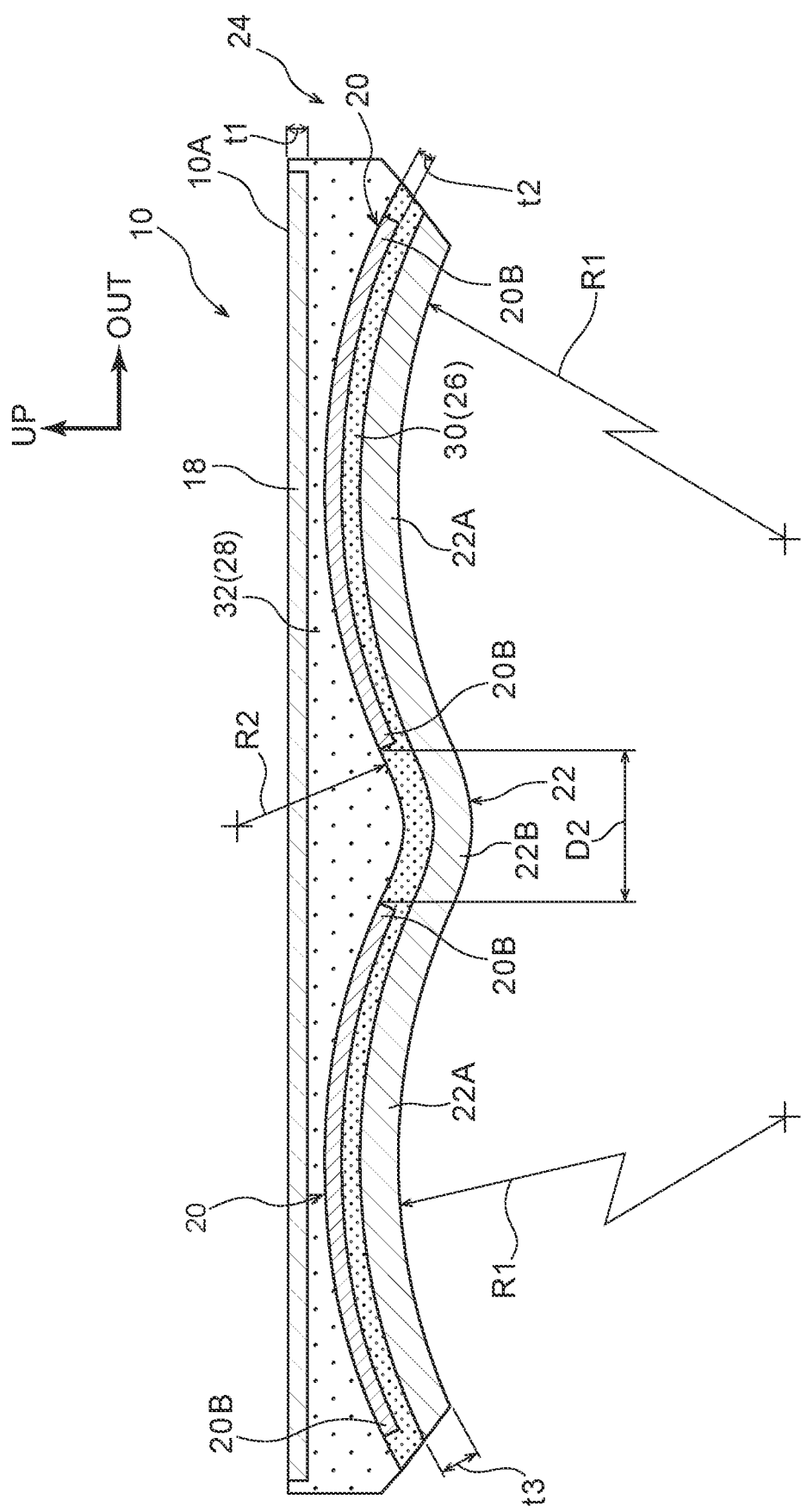

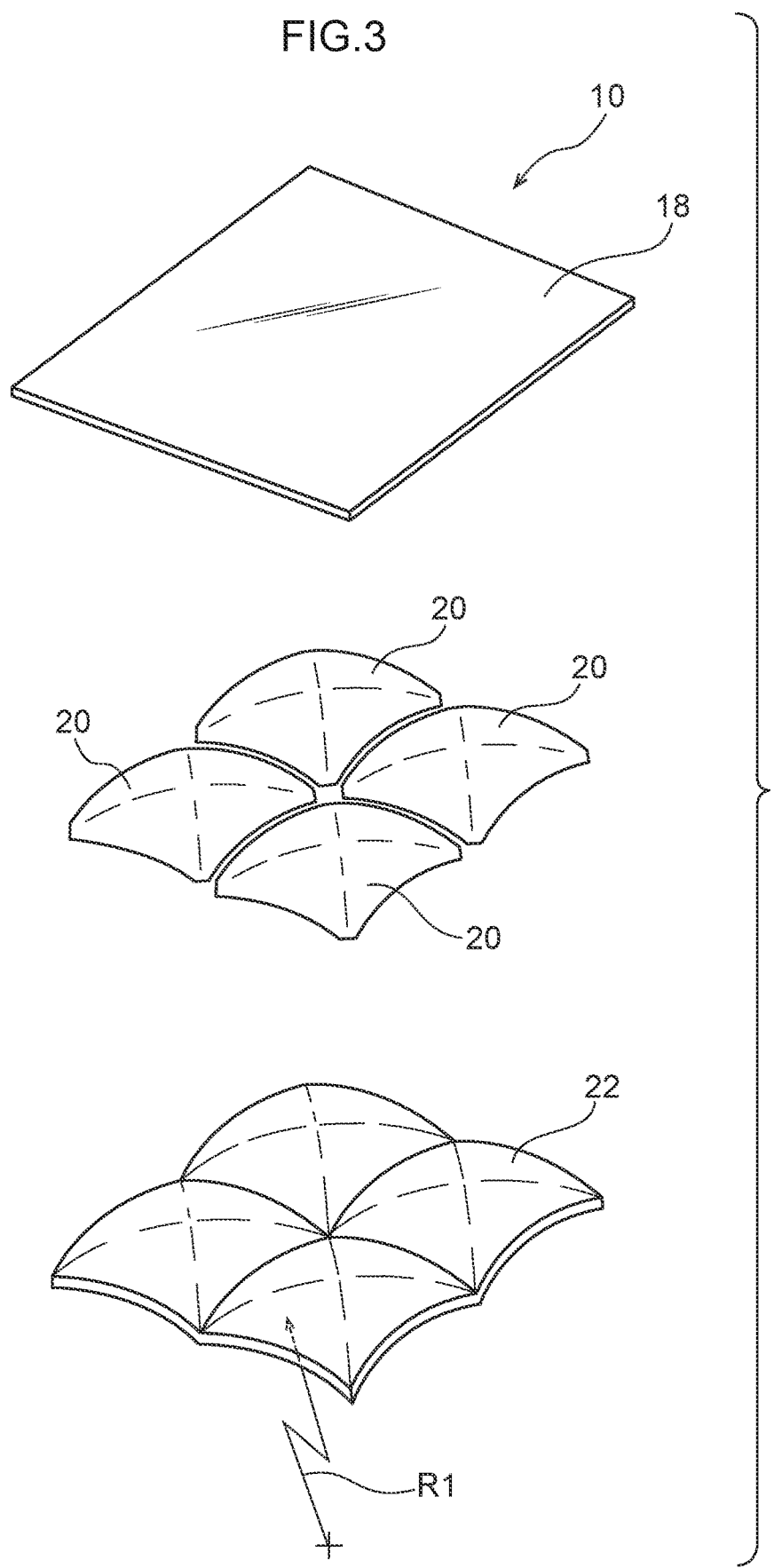

SOLAR BATTERY MODULE AND MANUFACTURING METHOD THEREFOR

CROSS-REFERENCE TO RELATED APPLICATION

This application claims priority under 35 USC 119 from Japanese Patent Application No. 2017-114726 filed Jun. 9, 2017, the disclosure of which is incorporated by reference herein in its entirety.

BACKGROUND

Technical Field

The present disclosure relates to a solar battery module and a manufacturing method therefor.

Related Art

Japanese Patent Application Laid-Open (JP-A) No. 2012-074530 discloses an invention relating to a solar battery module. In this solar battery module, an encapsulating material is used to fix a solar battery cell to a glass substrate. The direction of curvature of a curved profile of the substrate is set to match the direction of curvature of a curved profile of the solar battery cell. This thereby enables distortion of the solar battery cell to be suppressed when fixing the solar battery cell to the substrate.

SUMMARY

However, the above technology leaves room for improvement when it comes to suppressing load from affecting a solar battery cell when localized load is input to a sunlight-incident side face of a solar battery module.

In consideration of the above circumstances, an object of preferred embodiments is to provide a solar battery module capable of suppressing load from affecting a solar battery cell when localized load is input, and a manufacturing method for such solar battery module.

A solar battery module of a first aspect of the disclosure includes: a front face protective sheet, a solar battery cell, a backing sheet, and an encapsulation layer. The front face protective sheet is formed in a sheet shape, configures a face at a first side, and permits passage of sunlight. The solar battery cell is sheet-shaped and disposed at a second side, the second side being an opposite side from the first side, with respect to the front face protective sheet. The backing sheet is sheet-shaped and disposed at the second side with respect to the solar battery cell. The encapsulation layer is provided between the front face protective sheet and the backing sheet, and is formed from an encapsulating material that encapsulates the solar battery cell. Moreover, a convexly-curved portion is provided at the backing sheet, the convexly-curved portion overlapping with the solar battery cell as viewed along a sheet thickness direction of the solar battery cell, and curving toward a side of solar battery cell. The solar battery cell is disposed so as to curve in accordance with the convexly-curved portion. Furthermore, a rigidity of the convexly-curved portion with respect to a load acting in a sheet thickness direction of the solar battery cell is higher than a rigidity of the solar battery cell with respect to the load acting in the sheet thickness direction.

According to the first aspect, a face at the first side of the solar battery module is formed in a sheet shape, and is configured by the front face protective sheet that permits passage of sunlight. The sheet-shaped solar battery cell is disposed at the second side, the second side being the opposite side from the first side of the solar battery module, with respect to the front face protective sheet, and the sheet-shaped backing sheet is disposed at the second side with respect to the solar battery cell. The solar battery cell is encapsulated using the encapsulating material, that is provided between the front face protective sheet and the backing sheet. The encapsulating material configures the encapsulation layer. In the aspect configured as described above, the face at the first side of the solar battery module is disposed facing a sunlight-incident side. This enables electricity to be generated using sunlight as an energy source.

However, it might be thought input of localized load to the face at the first side of the solar battery module could affect the solar battery cell.

Note that in the first aspect, the convexly-curved portion is provided at the backing sheet. The convexly-curved portion overlaps with the solar battery cell as viewed along the sheet thickness direction of the solar battery cell, and curving convexly toward a side of the solar battery cell. The convexly-curved portion thus functions as an arch structure against localized load input to the face at the first side of the solar battery module. As a result, this load is suppressed from deforming the backing sheet, thereby enabling the solar battery cell to be suppressed from being affected by such deformation.

Moreover, the rigidity of the convexly-curved portion with respect to a load acting in the sheet thickness direction of the solar battery cell is set to be higher than the rigidity of the solar battery cell with respect to the load acting in the sheet thickness direction. Moreover, the solar battery cell is fixed to the backing sheet via the encapsulating material. Accordingly, the convexly-curved portion is capable of reinforcing the solar battery cell with respect to the load acting in the sheet thickness direction of the solar battery cell, enabling deformation of the solar battery cell due to such load to be suppressed.

A solar battery module of a second aspect of the disclosure is the first aspect of the disclosure, wherein plural solar battery cells are disposed along the backing sheet, and a concavely-curved portion which curves concavely away from the first side, is provided at the backing sheet between the solar battery cells as viewed from the first side.

According to the solar battery module of the second aspect of the disclosure, the concavely-curved portion which curves concavely away from the first side is provided between the plural solar battery cells disposed along the backing sheet as viewed from the first side of the solar battery module. Accordingly, during manufacture of the solar battery module, when injecting the encapsulating material between the front face protective sheet and the backing sheet, the concavely-curved portion can be utilized as a flow path for the encapsulating material. This thereby enables the encapsulating material to be injected between the front face protective sheet and the backing sheet in a short amount of time as a result, enabling the occurrence of air pockets in the vicinity of the solar battery cells to be suppressed.

A solar battery module of a third aspect of the disclosure is the first aspect or the second aspect, wherein the backing sheet is formed from a material having a higher coefficient of linear thermal expansion than a coefficient of linear thermal expansion of a material configuring each solar battery cell. The encapsulation layer includes a first encapsulation layer and a second encapsulation layer. The first encapsulation layer is disposed at the second side with respect to each solar battery cell and is configured from a thermosetting first encapsulating material that encapsulates the solar battery cell. The second encapsulation layer is disposed at the first side with respect to each solar battery cell. The second encapsulation layer encapsulates each solar battery cell, together with the first encapsulating material, and is configured from a second encapsulating material having a lower Young's modulus after curing than a Young's modulus of the first encapsulating material after curing. Moreover, each solar battery cell curves convexly toward a side of the front face protective sheet as a result of bending force being exerted from the backing sheet via the first encapsulation layer.

According to the solar battery module of the third aspect, the encapsulation layer is provided with the first encapsulation layer and the second encapsulation layer. The first encapsulation layer is disposed at the second side of the solar battery module with respect to the solar battery cell, and is configured from the thermosetting first encapsulating material that encapsulates each solar battery cell. The second encapsulation layer is disposed at the first side of the solar battery module and is configured by the second encapsulating material that, together with the first encapsulating material, encapsulates each solar battery cell.

Note that although each solar battery cell is reinforced by the backing sheet as described above, preferably each solar battery cell itself is also capable of supporting localized load input to the face at the first side of the solar battery module.

Note that in the present aspect, the backing sheet is formed from a material with a higher coefficient of linear thermal expansion than a coefficient of linear thermal expansion of the material forming the solar battery cell. Accordingly, the amount of shrinkage of the backing sheet per unit volume when the backing sheet cools from the thermosetting temperature of the first encapsulating material to room temperature is greater than the amount of shrinkage of the solar battery cell per unit volume when the solar battery cell cools from the thermosetting temperature of the first encapsulating material to room temperature. Moreover, each solar battery cell curves convexly toward the side of the front face protective sheet as a result of bending force caused by shrinkage of the backing sheet being exerted from the backing sheet via the first encapsulation layer provided between the solar battery cell and the backing sheet.

Moreover, in the third aspect, the Young's modulus of the second encapsulating material after curing is lower than the Young's modulus of the first encapsulating material after curing, thereby enabling bending force from the backing sheet to be transmitted readily from the backing sheet to each solar battery cell. Conversely, bending force from each solar battery cell can be suppressed from being transmitted from each solar battery cell to the front face protective sheet.

As a result, in the present aspect, each solar battery cell functions as an arch structure, thereby enabling load resistance of each solar battery cell with respect to localized load input to the face at the first side of the solar battery module to be improved in comparison to configurations in which each solar battery cell does not receive bending force from the backing sheet.

A solar battery module of a fourth aspect of the disclosure is any one of the first aspect to the third aspect, in which the backing sheet is configured to be disposed on a roof section of a vehicle in a state extending along a vehicle front-rear direction and a vehicle width direction as viewed from a vehicle upper side.

In the solar battery module of the fourth aspect, the backing sheet of the solar battery module is disposed on the roof section of the vehicle in a state extending along the vehicle front-rear direction and the vehicle width direction as viewed from the vehicle upper side. This thereby enables a wider sunlight-receiving area to be secured than in cases in which, for example, the solar battery module is disposed on a side section of the vehicle.

It might be thought that disposing the solar battery module on the roof section of the vehicle would result in the input of localized load to the solar battery module due to hail or the like. Note that as described above, in the present aspect, the backing sheet is provided with the convexly-curved portion. The convexly-curved portion functions as an arch structure against a load due to hail or the like, thereby enabling such a load to be suppressed from affecting the solar battery cell.

A solar battery module manufacturing method of a fifth aspect of the disclosure includes a first process and a second process. The first process is a process of forming a submodule by coating a face on one side of a sheet-shaped backing sheet with a first encapsulating material in a state prior to curing, adhering a solar battery cell, which is configured from a material having a lower coefficient of linear thermal expansion than a coefficient of linear thermal expansion of a material configuring the backing sheet, to the backing sheet using the first encapsulating material, and curing the first encapsulating material. The second process is a process of forming a solar battery module by disposing a front face protective sheet in an upper mold, disposing the submodule in a lower mold such that the solar battery cell faces an upper mold side, then in a state in which the upper mold and the lower mold have been placed together, injecting a second encapsulating material, that has a lower Young's modulus after curing than the Young's modulus after curing of the first encapsulating material, between the front face protective sheet and the submodule, and curing the second encapsulating material.

According to the solar battery module manufacturing method of the fifth aspect, in the first process, the face on the one side of the sheet-shaped backing sheet is coated with the first encapsulating material in a state prior to curing, the solar battery cell is adhered using the first encapsulating material, and the first encapsulating material is cured to form the submodule. In the second process, the front face protective sheet is disposed in the upper mold, and the submodule is disposed in the lower mold such that the solar battery cell faces the side of the upper mold. The second encapsulating material is injected between the front face protective sheet and the submodule in a state in which the upper mold and the lower mold have been placed together, and the second encapsulating material is cured to form the solar battery module.

In the fifth aspect, the coefficient of linear thermal expansion of the material configuring the solar battery cell is lower than the coefficient of linear thermal expansion of the material configuring the backing sheet. Accordingly, the amount of shrinkage of the backing sheet per unit volume when the backing sheet cools from the thermosetting temperature of the first encapsulating material to room temperature is greater than the amount of shrinkage of the solar battery cell per unit volume when the solar battery cell cools from the thermosetting temperature of the first encapsulating material to room temperature.

As a result, the solar battery cell curves convexly toward a side of the front face protective sheet as a result of bending force caused by shrinkage of the backing sheet being exerted from the backing sheet via the first encapsulation layer provided between the solar battery cell and the backing sheet as the backing sheet cools from the thermosetting temperature of the first encapsulating material to room temperature.

Moreover, in the fifth aspect, the Young's modulus of the second encapsulating material after curing is lower than the Young's modulus of the first encapsulating material after curing, thereby enabling bending force from the backing sheet to be transmitted readily from the backing sheet to the solar battery cell. Conversely, bending force from the solar battery cell can be suppressed from being transmitted from the solar battery cell to the front face protective sheet. Accordingly, the solar battery cell is able to function as an arch structure, thereby enabling load resistance of the solar battery cell with respect to localized load input to the face at the first side of the solar battery module to be improved in comparison to configurations in which the solar battery cell does not receive bending force from the backing sheet.

As described above, the solar battery module of the first aspect of the disclosure exhibits the excellent advantageous effect of enabling locally input load to be suppressed from affecting the solar battery cell.

The solar battery module of the second aspect of the disclosure exhibits the excellent advantageous effect of enabling peeling between the solar battery cell and the encapsulating material to be suppressed when the solar battery module is input with load, as air pockets are prevented from being formed in the vicinity of the solar battery cell.

The solar battery module of the third aspect of the disclosure exhibits the excellent advantageous effect of enabling the solar battery cell to support locally input load.

The solar battery module of the fourth aspect of the disclosure exhibits the excellent advantageous effects of both improving electricity generation efficiency and enabling localized load input to the roof section of the vehicle to be suppressed from affecting the solar battery cell.

The solar battery module manufacturing method of the fifth aspect of the disclosure exhibits the excellent advantageous effect of enabling locally input load to be suppressed from affecting the solar battery cell.

BRIEF DESCRIPTION OF THE DRAWINGS

An exemplary embodiment will be described in detail based on the following figures, wherein:

FIG. 1 is an enlarged cross-section schematically illustrating configuration of a solar battery module according to an exemplary embodiment (a cross-section schematically illustrating a cross-section taken along line 1-1 in FIG. 4);

FIG. 3 is an exploded perspective view schematically illustrating configuration of a solar battery module according to an exemplary embodiment.

DETAILED DESCRIPTION

Figure 4:
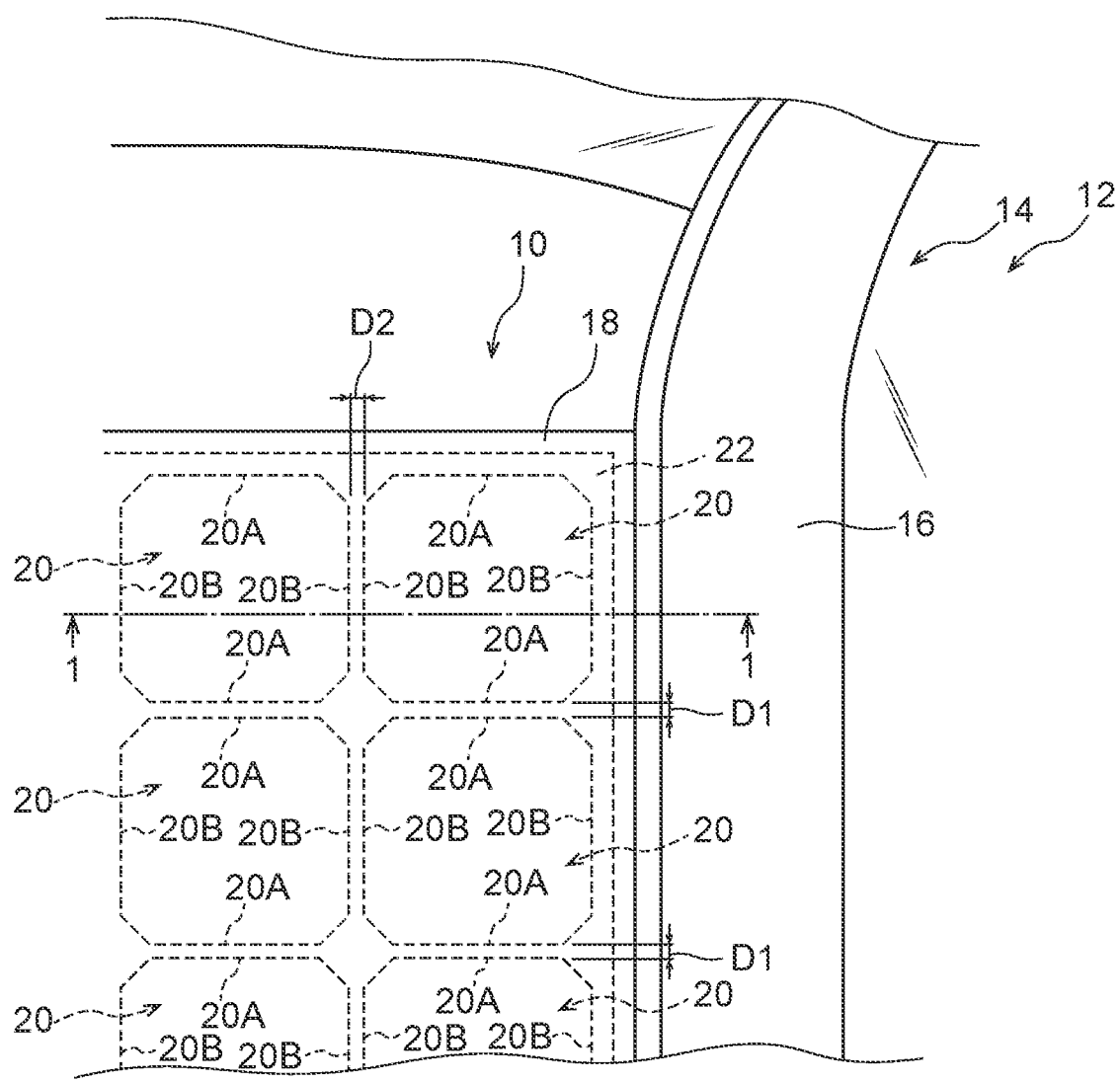
FIG. 4 is a plan view illustrating configuration of a vehicle installed with a solar battery module according to an exemplary embodiment.

Explanation follows regarding an example of an exemplary embodiment of a solar battery module according to the present invention, with reference to FIG. 1 to FIG. 4. This will be followed by explanation regarding a manufacturing method for the solar battery module according to the present exemplary embodiment. As illustrated in FIG. 4, as an example, in the present exemplary embodiment, a solar battery module 10 is disposed on a roof section 14 of a vehicle 12. Note that in the drawings used to explain the solar battery module 10 and the vehicle 12 (FIG. 1 to FIG. 4), an arrow FR points toward a vehicle front side, an arrow UP points toward a vehicle upper side, and an arrow OUT points toward a vehicle width direction outer side.

First, explanation follows regarding configuration of the roof section 14, with reference to FIG. 4. The roof section 14 is configured including a pair of roof side rails 16 that extend in a vehicle front-rear direction and that have closed cross-sections as viewed along a vehicle front-rear direction. The solar battery module 10 is disposed between the pair of roof side rails 16, and the solar battery module 10 is attached to non-illustrated flanges provided at the roof side rails 16 through attachment members, not illustrated in the drawings. Namely, the solar battery module 10 may be understood to configure part of a roof panel. Note that although an upper face of the roof section 14 curves convexly toward the vehicle upper side as viewed along the vehicle width direction, the roof section 14 is schematically illustrated as a flat face in the drawings.

As illustrated in FIG. 1 and FIG. 3, the solar battery module 10 is configured including a front face protective sheet 18, solar battery cells 20, and a backing sheet 22, disposed in this sequence from the vehicle upper side.

The front face protective sheet 18 is formed in a sheet shape and configures a first side face 10A (vehicle upper side face) of the solar battery module 10. More specifically, as viewed along a vehicle vertical direction, the front face protective sheet 18 extends along the vehicle front-rear direction and a vehicle width direction, and is set with a sheet thickness t1 of 0.8 mm. The front face protective sheet 18 is configured from a resin material that permits passage of sunlight, specifically a polycarbonate (PC) resin. The front face protective sheet 18 is provided to protect the solar battery cells 20 from corrosion by rain or gas, as well as from physical shock. The front face protective sheet 18 may be configured by a resin other than a polycarbonate resin so long as it is capable of protecting the solar battery cells 20 and permits passage of sunlight.

Examples of resins that may configure the front face protective sheet 18 include poly methyl methacrylate (PMMA) resins, polyethylene (PE) resins, polypropylene (PP) resins, polystyrene (PS) resins, styrene-acrylonitrile (SAN) copolymer resins, acrylonitrile butadiene styrene (ABS) copolymer resins, polyethylene terephthalate (PET) resins, polyethylene-naphthalate (PEN) resins, polyvinyl chloride (PVC) resins, polyvinylidene chloride (PVDC) resins, and polyamide (PA) resins.

Each solar battery cell 20 is sheet-shaped, and as viewed along its sheet thickness direction, each solar battery cell 20 is configured in an octagonal shape formed by removing isosceles triangle shapes from the four corners of a square having sides of 125 mm. A sheet thickness t2 of the solar battery cells 20 is set to 0.2 mm. The solar battery cells 20 are, for example, configured by polycrystalline silicon, and have a Young's modulus EA of from 50 GPa to 60 Gpa. A known solar battery cell may be employed for the solar battery cells 20, and any desired solar battery cell may be employed, for example a silicon type solar battery cell (such as monocrystalline silicon, microcrystalline silicon, or amorphous silicon), a compound semiconductor type solar battery cell (such as InGaAs, GaAs, CIGS, or CZTS), a dye-sensitized solar battery cell, or an organic thin-film solar battery cell.

The solar battery cells 20 configured as described above are disposed with their sheet thickness direction along the vehicle vertical direction, and are disposed at a second side (a vehicle lower side) of the solar battery module 10 with respect to the front face protective sheet 18. As viewed along the vehicle vertical direction, each solar battery cell 20 includes a pair of peripheral edges 20A that configure long edges of the solar battery cell 20, and a pair of peripheral edges 20B that also configure long edges of the solar battery cell 20 and extend orthogonally to the peripheral edges 20A. Plural of the solar battery cells 20 are arrayed along the vehicle width direction and the vehicle front-rear direction in a state in which the peripheral edges 20A extend in the vehicle width direction and the peripheral edges 20B extend in the vehicle front-rear direction. The solar battery cells 20 are disposed in a state in which a spacing D1 between adjacent peripheral edges 20A and a spacing D2 between adjacent peripheral edges 20B are each set to 4 mm as viewed along the vehicle vertical direction (see FIG. 4).

More specifically, the solar battery cells 20 are what are referred to as back contact solar battery cells, with plural electrodes, not illustrated in the drawings, being provided at intervals along an extension direction of the peripheral edges 20A at the back side (vehicle lower side) of the peripheral edges 20A. Non-illustrated tab lines are connected to these electrodes, and the respective solar battery cells 20 are electrically connected together through the tab lines. Electricity generated by the solar battery cells 20 is supplied to an electronic device installed in the vehicle 12 through a non-illustrated cable that is connected to the solar battery module 10. As described above, the backing sheet 22 is disposed at the second side of the solar battery module 10 with respect to the solar battery cells 20, such that the solar battery cells 20 are supported by the backing sheet 22.

In the present exemplary embodiment, an encapsulation layer 24 that encapsulates the solar battery cells 20 is present between the front face protective sheet 18 and the backing sheet 22. Detailed explanation follows regarding the configuration of the backing sheet 22 and the encapsulation layer 24.

The backing sheet 22 is, for example, configured by an aluminum sheet set with a Young's modulus EB of approximately 70 GPa and a sheet thickness t3 of 1.2 mm. As viewed along the vehicle vertical direction, the backing sheet 22 extends along the vehicle front-rear direction and the vehicle width direction. Note that the backing sheet 22 may be subjected to anodizing, electrodeposition coating, baking, or the like in order to ensure that the backing sheet 22 is electrically insulating. The backing sheet 22 may also be configured by a sheet of a metal other than aluminum, for example steel.

The backing sheet 22 is provided with plural convexly-curved portions 22A and plural concavely-curved portions 22B. The convexly-curved portions 22A of the backing sheet 22 are disposed where the backing sheet 22 overlaps with the solar battery cells 20 as viewed along the sheet thickness direction of the solar battery cells 20 (vehicle vertical direction), and curve convexly toward a solar battery cell 20 side (the vehicle upper side). The concavely-curved portions 22B of the backing sheet 22 are disposed between adjacent solar battery cells 20 as viewed from the first side of the solar battery module 10 (the vehicle upper side), and curve concavely away from the first side of the solar battery module 10.

More specifically, the convexly-curved portions 22A and the concavely-curved portions 22B are provided so as to be continuous to one another, in a state where the convexly-curved portions 22A are partitioned into squares by the concavely-curved portions 22B as viewed from the vehicle upper side. Namely, plural of the convexly-curved portions 22A are arrayed along the vehicle width direction and the vehicle front-rear direction as viewed from the vehicle upper side, and the concavely-curved portions 22B are disposed in a grid pattern as viewed from the vehicle upper side.

Each convexly-curved portion 22A is set with a radius of curvature R1 of from 2000 mm to 4000 mm to configure a spherical face having a center of curvature positioned at a position overlapping with the center of that convexly-curved portion 22A as viewed along the vehicle vertical direction. Namely, the convexly-curved portions 22A may be understood as having a shell structure or a domed structure.

The rigidity of the convexly-curved portions 22A with respect to load acting in the sheet thickness direction of the solar battery cells 20 is set so as to be higher than the rigidity of the solar battery cells 20 with respect to the load acting in the sheet thickness direction. More specifically, take a moment of inertia of area of a neutral axis in a solar battery cell 20 with respect to bending in the sheet thickness direction of the solar battery cell 20 (vehicle vertical direction) as I1, and take a moment of inertia of area of a neutral axis in a convexly-curved portion 22A with respect to bending in the sheet thickness direction of the convexly-curved portion 22A as I2. The relationship $I2 \times EB > I1 \times EA$ is thus realized between these second moments of area and the above-described Young's modulus EA of the solar battery cell 20 and the Young's modulus EB of the backing sheet 22 (convexly-curved portions 22A).

As described above, the concavely-curved portions 22B configure boundaries between adjacent convexly-curved portions 22A, and each concavely-curved portion 22B convexly curves toward the second side of the solar battery module 10 as viewed in cross-section along the extension direction of the concavely-curved portion 22B. Each concavely-curved portion 22B is set with a radius of curvature R2 of from 2 mm to 5 mm as viewed in cross-section along the extension direction. The radius of curvature R2 of the concavely-curved portions 22B may be set to approximately D2/2 mm based on the spacing D2 between adjacent solar battery cells.

As illustrated in FIG. 1, the encapsulation layer 24 includes a first encapsulation layer 26 and a second encapsulation layer 28. The first encapsulation layer 26 is configured by a thermosetting first encapsulating material 30 that is disposed on the second side of the solar battery module 10 with respect to the solar battery cells 20 and that encapsulates the solar battery cells 20. The second encapsulation layer 28 is configured by a thermosetting second encapsulating material 32 that is disposed on the first side of the solar battery module 10 with respect to the first encapsulation layer 26, and that, together with the first encapsulating material 30, encapsulates the solar battery cells 20.

More specifically, examples of the first encapsulating material 30 include thermoplastic resins, cross-linking resins, and the like, such as ionomer resins or olefin-based resins. For example, the first encapsulating material 30 satisfies the following conditions. Namely, a first condition may be that the first encapsulating material 30 is a resin with a thermosetting temperature is no less than 100° C. A second condition may be that the Young's modulus of the first encapsulating material 30 after curing is at least 100 MPa, with the Young's modulus preferably being from 250 MPa to 800 MPa. Note that various additives may be combined with the first encapsulating material 30 in order to improve the adhesiveness, weather-resistance, and the like of the first encapsulating material 30. Examples of additives to the first encapsulating material 30 include adhesion-promoting agents such as silane coupling agents, ultraviolet absorbing agents, anti-oxidization agents, and anti-discoloration agents.

Note that in the present exemplary embodiment, the coefficient of linear thermal expansion of the material configuring the solar battery cells 20 is approximately 4.0 [$\times 10^{-6}$/° C.], and the coefficient of linear thermal expansion of the material configuring the backing sheet 22 is approximately 23 [$\times 10^{-6}$/° C.]. Accordingly, the amount of shrinkage of the backing sheet 22 per unit volume when the backing sheet 22 cools from the thermosetting temperature of the first encapsulating material 30 to room temperature (5° C. to 35° C.) is greater than the amount of shrinkage of the solar battery cells 20 per unit volume when the solar battery cells 20 cool from the thermosetting temperature to room temperature. Moreover, in the present exemplary embodiment, the solar battery cells 20 are encapsulated in a state in which the solar battery cells 20 are curved so as to be convex toward the front face protective sheet 18 side (vehicle upper side) as a result of bending force, which is caused by shrinkage of the backing sheet 22, exerted from the backing sheet 22 via the first encapsulation layer 26 that is provided between the solar battery cells 20 and the backing sheet 22. This process may be understood as curving the solar battery cells 20 into shell structures or domed structures.

Examples of the second encapsulating material 32 include resins that can be maintained in a liquid state prior to curing or cross-linking, such as two-component Room Temperature Vulcanizing (RTV) silicone rubber or the like. Note that in the present exemplary embodiment, as an example, a 1:1 by weight mixture of KE-109E-A (manufactured by Shin-Etsu Chemical Co., Ltd.) and KE-109E-B (manufactured by Shin-Etsu Chemical Co., Ltd.) is employed as the second encapsulating material 32. Other examples of two-component mixture curing resins that may be employed as the second encapsulating material 32 include silicone resins, acrylic resins, urethane resins, and epoxy resins. Note that the Young's modulus of the second encapsulating material 32 after curing is approximately from 1 MPa to 20 MPa.

Next, explanation follows regarding the manufacturing method of the solar battery module 10, with reference to FIG. 2.

First, explanation follows regarding an example of configuration of a mold 34 employed in the manufacture of the solar battery module 10. Note that in FIG. 2, an arrow UP points toward a mold upper side, and an arrow OUT points toward a mold outer side. The mold 34 is configured including an upper mold 36, a lower mold 38 that is placed against the upper mold 36, and injection portions 40 that are integrally provided to the lower mold 38.

The upper mold 36 is formed with an upper side cavity 36A. A mold upper side face of the upper side cavity 36A configures an upper side molding face 36A1 that has a profile corresponding to that of the front face protective sheet 18 and to which the front face protective sheet 18 can be fixed. More specifically, the upper mold 36 is provided with a non-illustrated vacuum adhesion mechanism. Actuating the vacuum adhesion mechanism enables the front face protective sheet 18 to be fixed to the upper side molding face 36A1.

A peripheral wall 36B of the upper mold 36 is provided with air discharge portions 42 that place the inside and outside of the upper side cavity 36A in communication with each other at plural locations. As will be described later, during injection of the second encapsulating material 32, air inside the upper side cavity 36A can be discharged to outside the mold 34 through the air discharge portions 42.

The lower mold 38 is formed with a lower side cavity 38A. A mold lower side face of the lower side cavity 38A configures a lower side molding face 38A1 that has a profile corresponding to that of the backing sheet 22, and on which the backing sheet 22 can be placed. The lower mold 38 is provided with communication portions 44 that place a lower face 38B of the lower mold 38 and the lower side cavity 38A in communication with each other. The injection portions 40 are provided at the communication portions 44.

Each injection portion 40 is formed in a circular cylinder shape extending in a mold vertical direction, and a side at one end portion 40A of the injection portion 40 projects a predetermined length into an inside of the lower side cavity 38A. The injection portions 40 are disposed at plural locations in the lower mold 38, and specifically, are disposed at positions at the lower side molding face 38A1 corresponding to locations where the concavely-curved portions 22B of the backing sheet 22 intersect one another. Although only illustrated in FIG. 2, locations of the backing sheet 22 where the concavely-curved portions 22B intersect each other are formed with insertion portions 46 through which the injection portions 40 can be inserted.

A non-illustrated liquid resin molding device is connected to another end portion 40B of each injection portion 40. The liquid resin molding device mixes a primary agent and a secondary agent of the second encapsulating material 32 at a fixed ratio, and injects the second encapsulating material 32 into the injection portion 40. Note that the injection portion 40 may be integrally provided to the lower mold 38, and in such cases, the lower mold 38 is provided with connection portions for the liquid resin molding device.

Next, explanation follows regarding manufacturing processes for the solar battery module 10, employing the mold 34.

Figure 2A:
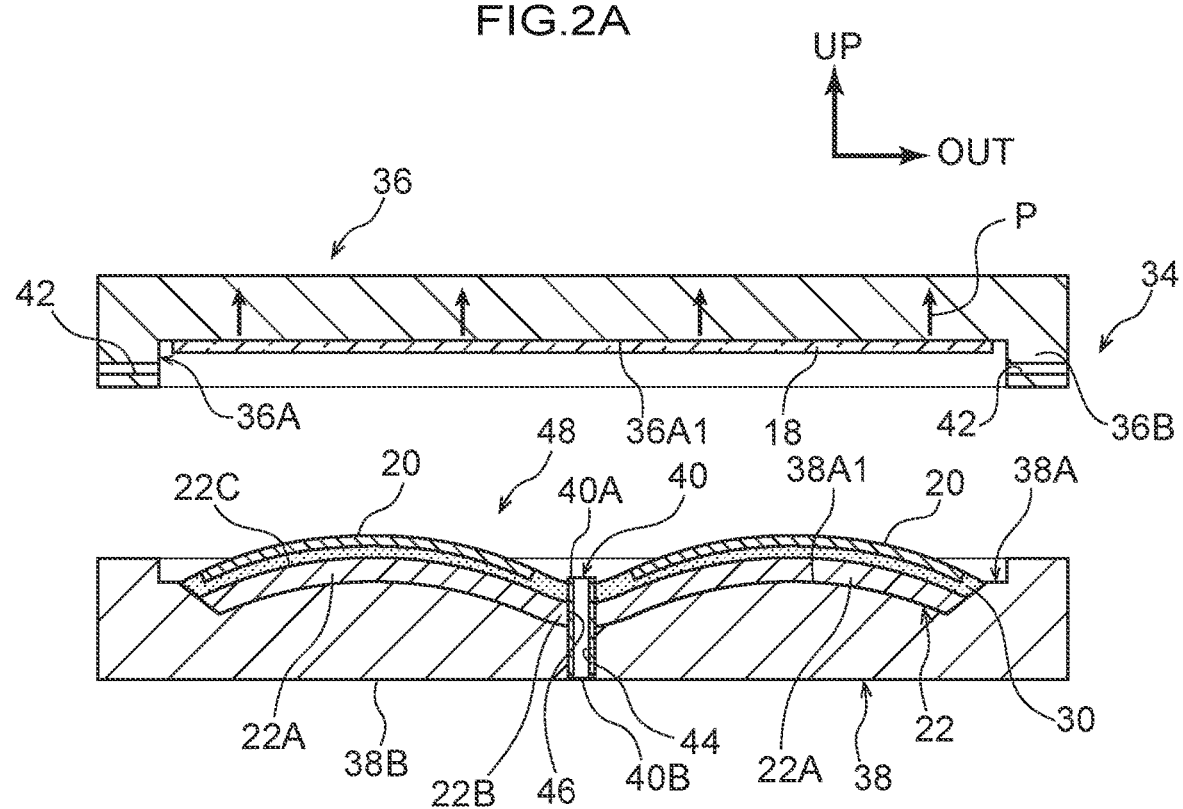
FIG. 2A is a cross-section schematically illustrating a manufacturing process of a solar battery module according to an exemplary embodiment, namely illustrating a relationship between a mold and configuration elements of the solar battery module in a first process.

In a first process, a face 22C on the one side of the backing sheet 22 is coated with the first encapsulating material 30, and the solar battery cells 20 are affixed to the convexly-curved portions 22A using the first encapsulating material 30. The backing sheet 22 is then heated to approximately 100° C. to cause the first encapsulating material 30 to undergo curing (undergo thermal cross-linking), resulting in the formation of a submodule 48. Note that in the submodule 48, for example, a predetermined number of the solar battery cells 20 are affixed to the face 22C on the one side of the backing sheet 22. As illustrated in FIG. 2A, when the submodule 48 formed in this manner is placed on the lower side molding face 38A1 of the lower mold 38, the submodule 48 is positioned such that the solar battery cells 20 are on the side of the upper mold 36, and the injection portions 40 are inserted through the insertion portions 46 in the backing sheet 22. In the upper mold 36, the vacuum adhesion mechanism is actuated such that negative pressure P acts on the front face protective sheet 18, thereby fixing the front face protective sheet 18 to the upper side molding face 36A1.

Figure 2B:
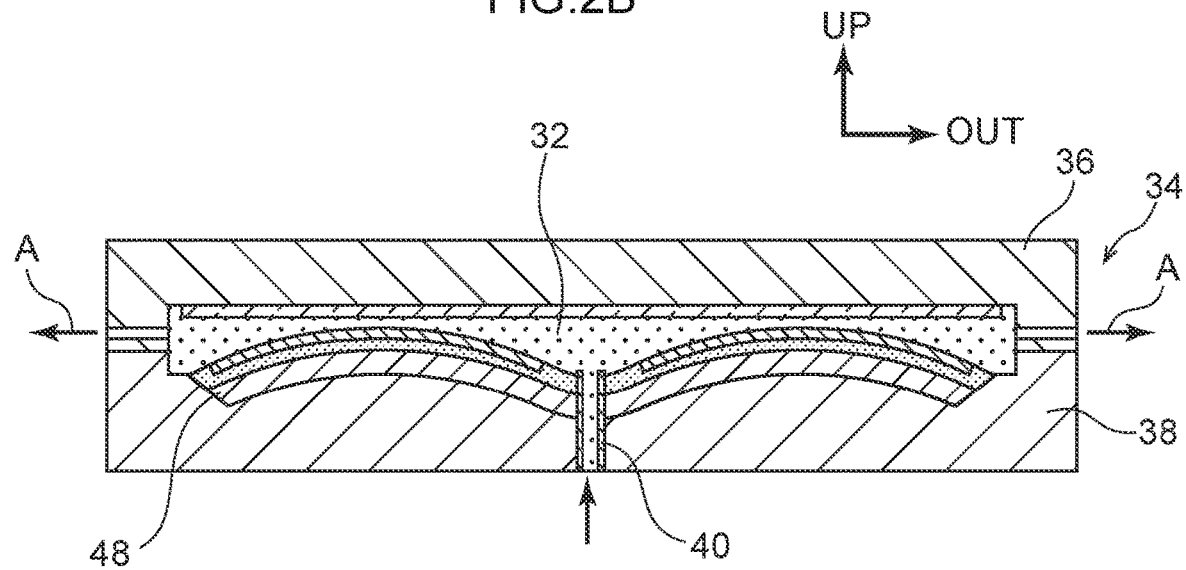
FIG. 2B is a cross-section illustrating a relationship between the mold and respective configuration elements of the solar battery module in a second process.

In a second process, as illustrated in FIG. 2B, in a state in which the upper mold 36 and the lower mold 38 have been placed together, the second encapsulating material 32 is injected between the front face protective sheet 18 and the submodule 48. More specifically, during injection of the second encapsulating material 32, the mold 34 is kept at a temperature of approximately 60° C., and in this state, the liquid resin molding device fills the second encapsulating material 32 between the front face protective sheet 18 and the submodule 48 via the injection portion 40. Note that when filling with the second encapsulating material 32, air A between the front face protective sheet 18 and the submodule 48 is discharged to the outside of the mold 34 through the air discharge portions 42. The second encapsulating material 32 filled between the front face protective sheet 18 and the submodule 48 then undergoes curing, thereby forming the solar battery module 10.

Operation and Advantageous Effects of the Present Exemplary Embodiment

Next, explanation follows regarding operation and advantageous effects of the present exemplary embodiment.

As illustrated in FIG. 1, in the present exemplary embodiment, the first side face 10A of the solar battery module 10 is configured by the front face protective sheet 18 that is formed in a sheet shape and that permits the passage of sunlight. The sheet-shaped solar battery cells 20 are disposed at the second side of the solar battery module 10 with respect to the front face protective sheet 18, and the sheet-shaped backing sheet 22 is disposed on the second side with respect to the solar battery cells 20. The solar battery cells 20 are encapsulated by the first encapsulating material 30 and the second encapsulating material 32 that are provided between the front face protective sheet 18 and the backing sheet 22. The encapsulation layer 24 is configured by the first encapsulating material 30 and the second encapsulating material 32. The face 10A of the solar battery module 10 configured as described above is disposed facing a sunlight-incident side. This enables electricity to be generated using sunlight as an energy source.

However, it might be thought that input of localized load to the face 10A of the solar battery module 10 could affect the solar battery cells 20.

Note that in the present exemplary embodiment, the backing sheet 22 is provided with the convexly-curved portions 22A. The convexly-curved portions 22A overlap with the solar battery cells 20 as viewed along the sheet thickness direction of the solar battery cells 20, and curve so as to be convex toward the solar battery cell 20 side. The convexly-curved portions 22A thus function as arch structures against localized load input to the face 10A of the solar battery module 10.

More specifically, localized load input to the convexly-curved portions 22A through the face 10A side of the solar battery module 10 acts at the convexly-curved portions 22A as compression load in directions following the convexly-curved portions 22A, and the load is supported by the convexly-curved portions 22A. As a result, localized load input to the face 10A of the solar battery module 10 is suppressed from deforming the backing sheet 22, thereby enabling the solar battery cells 20 to be suppressed from being affected by such deformation.

Moreover, the rigidity of the convexly-curved portions 22A of the backing sheet 22 with respect to load acting in the sheet thickness direction of the solar battery cells 20 is set so as to be higher than the rigidity of the solar battery cells 20 with respect to the load acting in this sheet thickness direction. Moreover, the solar battery cells 20 are fixed to the backing sheet 22 via the first encapsulating material 30 and the second encapsulating material 32. The convexly-curved portions 22A are therefore capable of reinforcing the solar battery cells 20 with respect to load acting in the sheet thickness direction of the solar battery cells 20, enabling deformation of the solar battery cells 20 as a result of such load to be suppressed. Accordingly, the present exemplary embodiment enables localized load to be suppressed from affecting the solar battery cells 20 when such localized load is input to the solar battery module 10.

Moreover, the present exemplary embodiment is provided with the concavely-curved portions 22B that, as viewed from the first side of the solar battery module 10, curve concavely away from the first side between the plural solar battery cells 20 disposed following the backing sheet 22. Accordingly, during manufacture of the solar battery module 10, when injecting the second encapsulating material 32 between the front face protective sheet 18 and the backing sheet 22, the concavely-curved portions 22B can be utilized as flow paths for the second encapsulating material 32. This thereby enables the second encapsulating material 32 to be injected between the front face protective sheet 18 and the backing sheet 22 in a short amount of time as a result, enabling the occurrence of air pockets in the vicinity of the solar battery cells 20 to be suppressed. The present exemplary embodiment is thus capable of suppressing peeling between the solar battery cells 20 and the second encapsulating material 32 originating at air pockets in the vicinity of the solar battery cells 20 when load is input to the solar battery module 10.

Moreover, in the present exemplary embodiment, the encapsulation layer 24 is provided with the first encapsulation layer 26 and the second encapsulation layer 28. The first encapsulation layer 26 is disposed at the second side of the solar battery module 10 with respect to the solar battery cells 20, and is configured by the thermosetting first encapsulating material 30 that encapsulates the solar battery cells 20. The second encapsulation layer 28 is disposed at the first side of the solar battery module 10 with respect to the first encapsulation layer 26 and is configured by the second encapsulating material 32 that together with the first encapsulating material 30 encapsulates the solar battery cells 20.

Note that although the solar battery cells 20 are reinforced by the backing sheet 22 as described above, preferably the solar battery cells 20 themselves are also capable of supporting localized load input to the face 10A of the solar battery module 10.

Note that in the present exemplary embodiment, the backing sheet 22 is configured by a material with higher coefficient of linear thermal expansion than the coefficient of linear thermal expansion of the material configuring the solar battery cells 20. Accordingly, the amount of shrinkage of the backing sheet 22 per unit volume, when the backing sheet 22 cools from the thermosetting temperature of the first encapsulating material 30 to room temperature, is greater than the amount of shrinkage of the solar battery cells 20 per unit volume when the solar battery cells 20 cool from the thermosetting temperature of the first encapsulating material 30 to room temperature. Moreover, the solar battery cells 20 curve so as to be convex toward the front face protective sheet 18 side as a result of bending force caused by shrinkage of the backing sheet 22 being exerted from the backing sheet 22 via the first encapsulation layer 26 that is provided between the solar battery cells 20 and the backing sheet 22.

Moreover, in the present exemplary embodiment, the Young's modulus of the second encapsulating material 32 after curing is lower than the Young's modulus of the first encapsulating material 30 after curing, thereby enabling bending force from the backing sheet 22 to be transmitted readily from the backing sheet 22 to the solar battery cells 20. Conversely, bending force by the solar battery cells 20 can be suppressed from being transmitted from the solar battery cells 20 to the front face protective sheet 18.

As a result, in the present exemplary embodiment, the solar battery cells 20 function as arch structures against localized load input to the face 10A of the solar battery module 10. More specifically, in the solar battery cells 20, localized load input to the solar battery cells 20 via the face 10A side of the solar battery module 10 acts as compression load in directions following the solar battery cells 20, and the load is supported by the solar battery cells 20. As a result, the load resistance of the solar battery cells 20 with respect to localized load input to the face 10A of the solar battery module 10 can be improved in comparison to configurations in which the solar battery cells 20 do not receive bending force from the backing sheet 22. Accordingly, in the present exemplary embodiment, when localized load is input to the solar battery module 10, this load can be supported by the solar battery cells 20.

Moreover, in the present exemplary embodiment, the backing sheet 22 of the solar battery module 10 is disposed on the roof section 14 of the vehicle 12 in a state extending along the vehicle front-rear direction and the vehicle width direction as viewed from the vehicle upper side. This thereby enables a wider sunlight-receiving area to be secured than in cases in which, for example, the solar battery module 10 is disposed on a side section of the vehicle 12.

It might be thought that disposing the solar battery module 10 on the roof section 14 of the vehicle 12 would result in the input of localized load to the solar battery module 10 due to hail or the like. Note that as described above, in the present exemplary embodiment, the backing sheet 22 is provided with the convexly-curved portions 22A. The convexly-curved portions 22A function as arch structures against load due to hail or the like, thereby enabling such load to be suppressed from affecting the solar battery cells 20. Moreover, the solar battery cells 20 curve so as to be convex toward the front face protective sheet 18 side due to the bending force received via the first encapsulation layer 26, thereby enabling the solar battery cells 20 to support load due to hail or the like.

The solar battery module 10 configured as described above secures overall rigidity with respect to load in directions along the solar battery module 10 (directions along the neutral axis with respect to bending in the sheet thickness direction of the solar battery module 10). Accordingly, the solar battery module 10 is capable of suppressing buckling even if the solar battery module 10 is pressed, for example when washing the vehicle. Accordingly, the present exemplary embodiment is capable of achieving both greater power generation efficiency of the solar battery module 10 and of suppressing localized load on the roof section 14 of the vehicle 12 from affecting the solar battery cells 20.

Supplementary Explanation of the Above Exemplary Embodiment (1) In the exemplary embodiment described above, the solar battery module 10 is disposed on the roof section 14 of the vehicle 12. However, there is no limitation thereto. For example, depending on the configuration of the vehicle 12, the solar battery module 10 may be disposed on a side door or the like of the vehicle 12, such that the face 10A faces toward the vehicle width direction outer side.

(2) Moreover, in the exemplary embodiment described above, the convexly-curved portions 22A of the backing sheet 22 have spherical face profiles. However, there is no limitation thereto. For example, depending on the configuration of the solar battery cells 20, the convexly-curved portions 22A may be configured with cylindrical arch shaped profiles.

(3) Moreover, in the exemplary embodiment described above, the backing sheet 22 is formed from an aluminum sheet material. However, there is no limitation thereto. Namely, the material of the backing sheet 22 may be modified as appropriate so long as the Young's modulus EA and the moment of inertia of area I1 of the solar battery cells 20 and the Young's modulus EB and the moment of inertia of area I2 of the convexly-curved portions 22A have the relationship I2×EB>I1×EA. For example, the backing sheet 22 may be formed from Carbon Fiber Reinforced Plastic (CFRP), enabling the backing sheet 22 to be made more lightweight.

(4) Moreover, in the exemplary embodiment described above, the encapsulation layer 24 is made by the first encapsulating material 30 and the second encapsulating material 32. However, there is no limitation thereto. For example, depending on the manufacturing processes and the like of the solar battery module 10, the encapsulation layer 24 may be made by a single type of encapsulating material. Moreover, the encapsulating material configuring the encapsulation layer 24 may be made by a resin other than a thermoplastic resin.

What is claimed is:

1. A solar battery module, comprising:
   a front face protective sheet formed in a sheet shape, configuring a face at a first side, and permitting passage of sunlight;
   a sheet-shaped backing sheet defining a second side opposite the first side, the backing sheet having a convexly-curved portion with a convexly-curved contour that is curved in a first direction toward the face at the first side in a cross-section view of the solar battery module;
   a sheet-shaped solar battery cell disposed in between the front face protective sheet and the backing sheet, the solar battery cell having a convexly-curved contour in the cross-section view of the solar battery module; and
   an encapsulation layer provided between the front face protective sheet and the backing sheet, and formed from an encapsulating material that encapsulates the solar battery cell, wherein:
   the convexly-curved portion of the backing sheet overlaps with the solar battery cell along a sheet thickness direction of the solar battery cell,
   the convexly-curved contour of the solar battery cell conforms with the convexly-curved contour of the convexly-curved portion of the backing sheet, and
   a rigidity of the convexly-curved portion of the backing sheet with respect to a load acting in the sheet thickness direction of the solar battery cell is higher than a rigidity of the solar battery cell with respect to the load acting in the sheet thickness direction.

2. The solar battery module of claim 1, wherein:
   a plurality of the solar battery cells are disposed along the backing sheet; and
   a concavely-curved portion is provided at the backing sheet and between the solar battery cells, as viewed along a sheet thickness direction of the solar battery cell, and the concavely-curved portion is curved in a second direction opposite to the first direction and away from the face at the first side in a cross-section view of the solar battery module.

3. The solar battery module of claim 1, wherein:
the backing sheet is formed from a material having a higher coefficient of linear thermal expansion than a coefficient of linear thermal expansion of a material that forms each solar battery cell;
the encapsulation layer includes:
a first encapsulation layer that is disposed at a first face of each solar battery cell and that is configured from a thermosetting first encapsulating material that encapsulates each solar battery cell, and
a second encapsulation layer that is disposed at a second face of each solar battery cell, that, together with the first encapsulating material, encapsulates each solar battery cell, and that is configured from a second encapsulating material having a lower Young's modulus after curing than a Young's modulus of the first encapsulating material after curing, wherein the second face of each solar battery cell is opposite to the first face of each solar battery cell; and
each solar battery cell is configured to curve in the first direction on receipt of a bending force from the backing sheet via the first encapsulation layer.

4. The solar battery module of claim 2, wherein:
the backing sheet is formed from a material having a higher coefficient of linear thermal expansion than a coefficient of linear thermal expansion of a material that forms each solar battery cell;
the encapsulation layer includes:
a first encapsulation layer that is disposed at a first face of each solar battery cell and that is configured from a thermosetting first encapsulating material that encapsulates each solar battery cell, and
a second encapsulation layer that is disposed at a second face of each solar battery cell, that, together with the first encapsulating material, encapsulates each solar battery cell, and that is configured from a second encapsulating material having a lower Young's modulus after curing than a Young's modulus of the first encapsulating material after curing, wherein the second face of each solar battery cell is opposite to the first face of each solar battery cell; and
each solar battery cell is configured to curve in the first direction on receipt of a bending force from the backing sheet via the first encapsulation layer.

5. The solar battery module of claim 1, wherein the backing sheet is configured to be disposed on a roof section of a vehicle such that the backing sheet extends along a vehicle front-rear direction and a vehicle width direction as viewed from a vehicle upper side.

6. A solar battery module manufacturing method, comprising:
a first process including: (i) forming a submodule by coating a face on one side of a sheet-shaped backing sheet with a first encapsulating material in a state prior to curing, (ii) adhering a solar battery cell, which is configured from a material having a lower coefficient of linear thermal expansion than a coefficient of linear thermal expansion of a material configuring the backing sheet, to the backing sheet using the first encapsulating material, and (iii) curing the first encapsulating material; and
a second process including: (i) forming a solar battery module by disposing a front face protective sheet in an upper mold, (ii) disposing the submodule in a lower mold such that the solar battery cell faces an upper mold side, (iii) then, in a state in which the upper mold and the lower mold have been placed together, injecting a second encapsulating material, which has a lower Young's modulus after curing than a Young's modulus of the first encapsulating material after curing, between the front face protective sheet and the submodule, and (iv) curing the second encapsulating material.

7. The solar battery module of claim 1, wherein the convexly-curved portion of the backing sheet has a radius of curvature of from 2,000 mm to 4,000 mm.

8. The solar battery module of claim 2, wherein the convexly-curved portion of the backing sheet has a radius of curvature of from 2,000 mm to 4,000 mm.

9. The solar battery module of claim 8, wherein the concavely-curved portion of the backing sheet has a radius of curvature of from 2 mm to 5 mm.

10. The solar battery module of claim 3, wherein the backing sheet is made from a sheet of metal.

11. The solar battery module of claim 10, wherein the material of the solar battery cell has a Young's modulus in a range of from 50 GPa to 60 GPa.

12. The solar battery module of claim 11, wherein the Young's modulus of the first encapsulating material after curing is in a range of from 250 MPa to 800 MPa.

13. The solar battery module of claim 12, wherein the Young's modulus of the second encapsulating material after curing is in a range of from approximately 1 MPa to 20 MPa.

14. The solar battery module of claim 4, wherein the backing sheet is made from a sheet of metal.

15. The solar battery module of claim 14, wherein the material of the solar battery cell has a Young's modulus in a range of from 50 GPa to 60 GPa.

16. The solar battery module of claim 15, wherein the Young's modulus of the first encapsulating material after curing is in a range of from 250 MPa to 800 MPa.

17. The solar battery module of claim 16, wherein the Young's modulus of the second encapsulating material after curing is in a range of from approximately 1 MPa to 20 MPa.

* * * * *